US 10,096,417 B2
Oct. 9, 2018

(54) COMMON MODE NOISE FILTER

(71) Applicant: Panasonic Intellectual Property Management Co., Ltd., Osaka (JP)

(72) Inventors: Yoshiharu Omori, Osaka (JP); Kenichi Matsushima, Hyogo (JP); Ryohei Harada, Fukui (JP); Kenji Ueno, Fukui (JP); Atsushi Shinkai, Fukui (JP); Nariaki Ishida, Fukui (JP); Takeshi Ichihara, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 111 days.

(21) Appl. No.: 15/317,860

(22) PCT Filed: Nov. 2, 2015

(86) PCT No.: PCT/JP2015/005492
§ 371 (c)(1),
(2) Date: Dec. 9, 2016

(87) PCT Pub. No.: WO2016/072078
PCT Pub. Date: May 12, 2016

(65) Prior Publication Data
US 2017/0294257 A1    Oct. 12, 2017

(30) Foreign Application Priority Data
Nov. 5, 2014    (JP) ................................. 2014-224821

(51) Int. Cl.
*H01F 27/28*    (2006.01)
*H01F 5/00*    (2006.01)
(Continued)

(52) U.S. Cl.
CPC ......... *H01F 17/0013* (2013.01); *H01F 27/29* (2013.01); *H03H 7/09* (2013.01);
(Continued)

(58) Field of Classification Search
USPC .................................. 336/170, 200, 232, 83
See application file for complete search history.

(56) References Cited

U.S. PATENT DOCUMENTS

2004/0130415 A1*  7/2004  Chiba ................. H01F 17/0013
                                                        333/185
2012/0098623 A1*  4/2012  Taniguchi ................. H01P 5/10
                                                        333/185
(Continued)

FOREIGN PATENT DOCUMENTS

JP        3-211810        9/1991
JP        2002-373810     12/2002
(Continued)

OTHER PUBLICATIONS

International Search Report of PCT application No. PCT/JP2015/005492 dated Jan. 26, 2016.

*Primary Examiner* — Elvin G Enad
*Assistant Examiner* — Kazi Hossain
(74) *Attorney, Agent, or Firm* — McDermott Will & Emery LLP

(57) ABSTRACT

In a common mode noise filter, first coil (12) includes first coil conductor (16) and second coil conductor (17) with spiral shapes. Second coil (13) includes third coil conductor (18) and fourth coil conductor (19) with spiral shapes. First coil conductor (16), third coil conductor (18), second coil conductor (17), and fourth coil conductor (19) are placed in this order from above. First metal layer (14) configured to be connected to a ground is provided above first coil conductor (16).

16 Claims, 14 Drawing Sheets

(51) Int. Cl.
*H01F 17/00* (2006.01)
*H01F 27/29* (2006.01)
*H03H 7/09* (2006.01)

(52) U.S. Cl.
CPC ............... *H01F 2017/0073* (2013.01); *H01F 2017/0093* (2013.01)

(56) References Cited

U.S. PATENT DOCUMENTS

| | | | | |
|---|---|---|---|---|
| 2012/0313729 | A1* | 12/2012 | Togashi | H01P 1/20345 333/184 |
| 2013/0214889 | A1* | 8/2013 | Kim | H01F 17/0033 336/192 |
| 2014/0191824 | A1* | 7/2014 | Yoshino | H03H 7/427 333/185 |
| 2016/0172100 | A1* | 6/2016 | Ishida | H01F 17/0013 336/192 |

FOREIGN PATENT DOCUMENTS

| | | |
|---|---|---|
| JP | 2011-187676 | 9/2011 |
| JP | 2012-124470 | 6/2012 |
| JP | 2012-129665 | 7/2012 |
| JP | 2013-191660 | 9/2013 |

\* cited by examiner

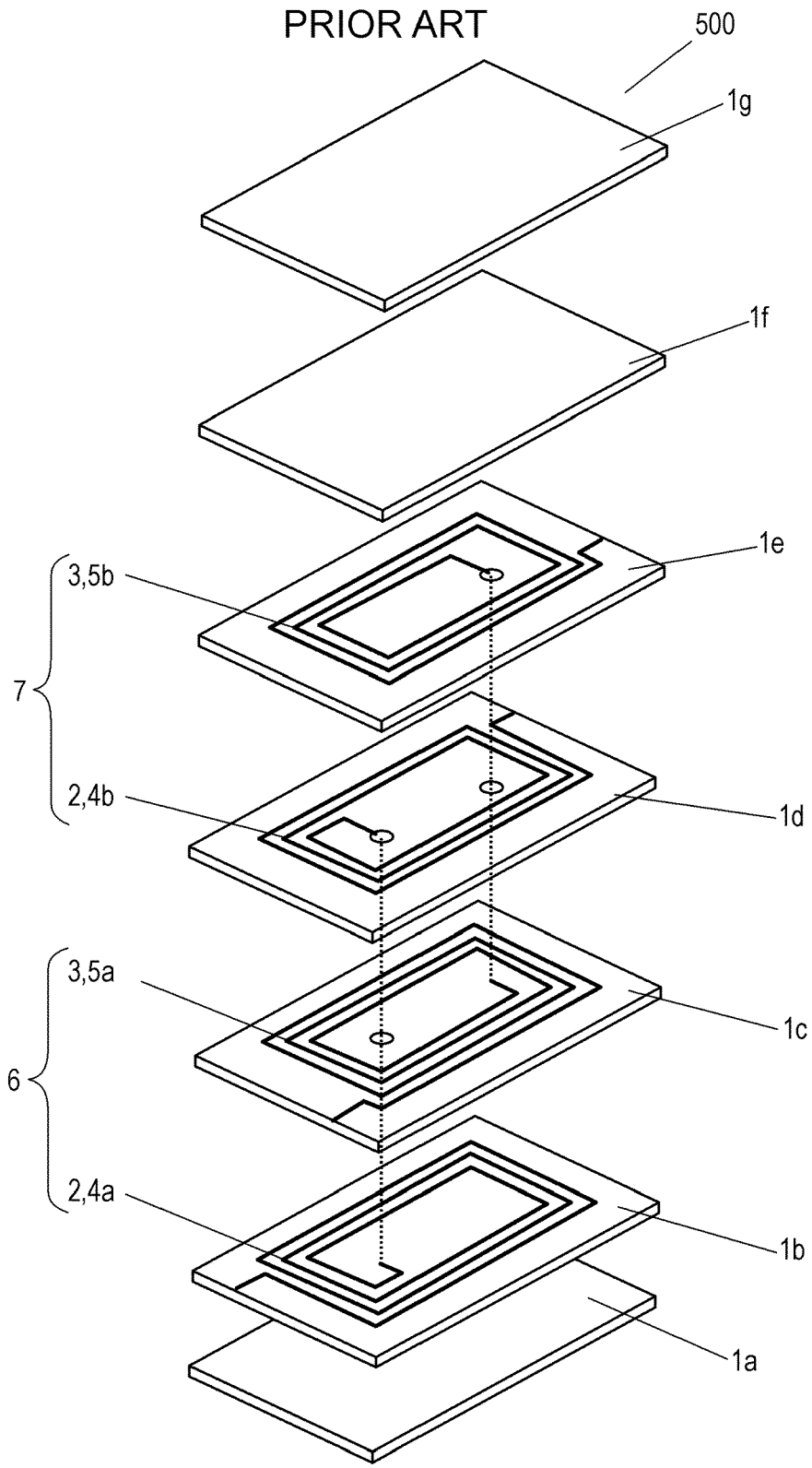

COMMON MODE NOISE FILTER

CROSS-REFERENCE TO RELATED APPLICATIONS

This application is a U.S. national stage application of the PCT international application No.PCT/JP2015/005492 filed on Nov. 2, 2015, which claims the benefit of foreign priority of Japanese patent application No. 2014-224821 filed on Nov. 5, 2014, the contents all of which are incorporated herein by reference.

TECHNICAL FIELD

The present invention relates to a small common mode noise filter having a low profile used for various electronic devices, such as digital equipment, audiovisual (AV) equipment, and information communications terminals.

BACKGROUND ART

FIG. 16 shows conventional common mode noise filter 500. Conventional common mode noise filter 500 includes stacked insulating layers 1a to 1g having upper surfaces on which coil 2 or coil 3 is provided. Coil 2 includes coil conductors 4a and 4b with spiral shapes. Coil conductor 4a is connected to coil conductor 4b. Coil 3 includes coil conductors 5a and 5b with spiral shapes. Coil conductor 5a is connected to coil conductor 5b. Coil conductors 4a and 4b of constituting coil 2 and coil conductor 5a and 5b constituting coil 3, are disposed alternately. Coil conductor 4a and coil conductor 5a are magnetically coupled to each other to form common mode filter 6. Coil conductor 4b and coil conductor 5b are magnetically coupled to each other to form common mode filter 7. Common mode filter 6 is connected in series to common mode filter 7. This configuration increases an impedance of common mode noise filter 500 with respect to a common mode, accordingly removing a common mode noise.

The technique about the above common mode noise filter is disclosed in, e.g. PTL 1.

CITATION LIST

Patent Literature

PTL 1: Japanese Patent Laid-Open Publication No. 2002-373810

SUMMARY

A common mode noise filter includes first to fifth insulating layers, and a first coil which includes a first coil conductor with a spiral shape provided on an upper surface of the first insulating layer and a second coil conductor with a spiral shape provided on an upper surface of the second insulating layer. The second coil conductor is provided below the first coil conductor. The common mode noise filter further includes a second coil which includes a third coil conductor with a spiral shape provided on an upper surface of the third insulating layer and a forth coil conductor with a spiral shape provided on an upper surface of the forth insulating layer. The forth coil conductor is provided below the third coil conductor. The common mode noise filter further includes a first metal layer provided on an upper surface of the fifth insulating layer, first to fourth external electrodes connected to the first to fourth coil conductors respectively, and a fifth external electrode connected to the first metal layer. The fifth external electrode is configured to be connected to a ground. The third coil conductor is provided between the first and second coil conductors. The second coil conductor is provided between the third and fourth coil conductors. The first and third coil conductors are magnetically coupled to each other to form a first common mode filter. The second and forth coil conductors are magnetically coupled to each other to form a second common mode filter. The first common mode filter is connected in series to the second common mode filter. The first metal layer is provided above the first coil conductor.

In another aspect of a positional relationship between the first, second, third, and fourth coil conductors, the first coil conductor may be provided between the third and second coil conductors, and the second coil conductor may be provided between the first and fourth coil conductors.

The common mode noise filter may include a first static-electricity passing part connected to the first, second, third, fourth, and fifth external electrodes. The first static-electricity passing part passes electricity upon having a voltage equal to or higher than a predetermined value applied thereto, and functions as an insulator upon having a voltage lower than the predetermined value applied thereto. The common mode noise filter may include a second static-electricity passing part electrically connected to the first, second, and fifth external electrodes, and a third static-electricity passing part electrically connected to the third, fourth, and fifth external electrodes. The first and second static-electricity passing parts have the same function as the first static-electricity passing part.

The above common mode noise filter can improve common-mode-noise attenuation characteristics in a wide frequency range.

BRIEF DESCRIPTION OF DRAWINGS

FIG. 16 is an exploded perspective view of the conventional common mode noise filter.

DETAIL DESCRIPTION OF PREFERRED EMBODIMENTS

Figure 1:
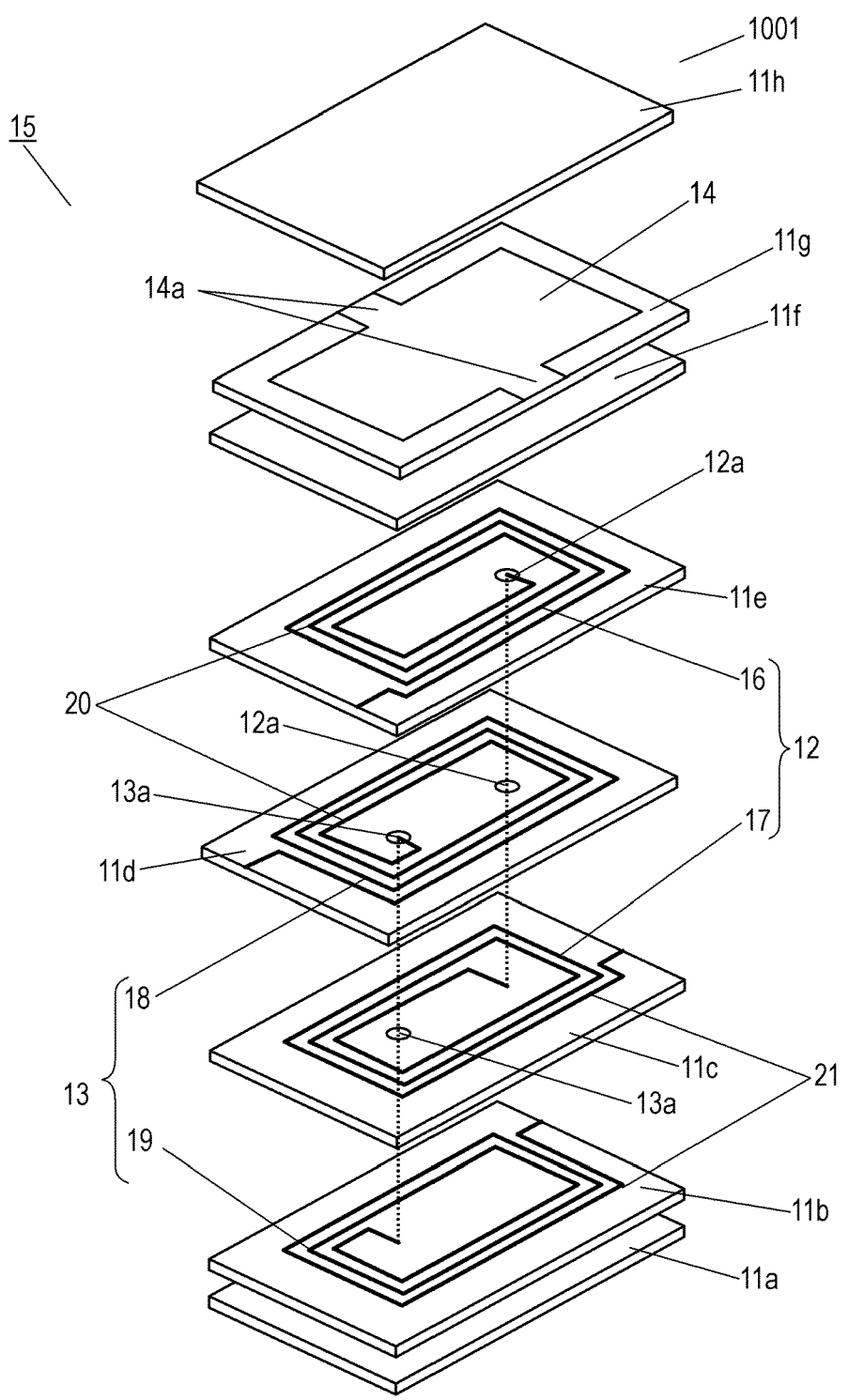
FIG. 1 is an exploded perspective view of a common mode noise filter in accordance with Exemplary Embodiment 1.

A problem of common mode noise filter 500 will be described with reference to FIG. 16.

A mobile terminal, such as a recent smart phone, is designed in consideration of multiple communication systems and communication bands. Especially in the case where the mobile terminal of a cellular wireless system is used in a wide communication frequency band from 700 MHz to 3 GHz, a noise filter thereof is required to satisfy noise attenuation characteristics in the communication frequency band.

However, when a common mode noise enters into common mode noise filter 500 shown in FIG. 16, common mode filters 6 and 7 function as inductors i.e., coil conductor 4a and coil conductor 5a are magnetically coupled to each other in upward and downward directions. Since coil conductors 4b and 5b are magnetically coupled to each other in the upward and downward directions, an impedance between input and output of coil 2 and an impedance between input and output of coil 3 are increased in common mode noise filter 500. Thus, a voltage between the input and output of coil 2 is different from a voltage between the input and output of coil 3, thereby producing a stray capacitance between the input and output of coil 2 and a stray capacitance between the input and output of coil 3. This causes self-resonance in a high frequency region. In such a high frequency region, i.e., above self-resonance frequency, common mode impedance is reduced. Thus, attenuation characteristics of common mode noise is deteriorated in the high frequency region. As a result, common mode noise filter 500 has a problem that a common mode noise is not attenuated in a wide frequency range.

A common mode noise filter capable of improving attenuation characteristics of common mode noise in a wide frequency range will be described with reference to the drawings.

Exemplary Embodiment 1

Figure 2:
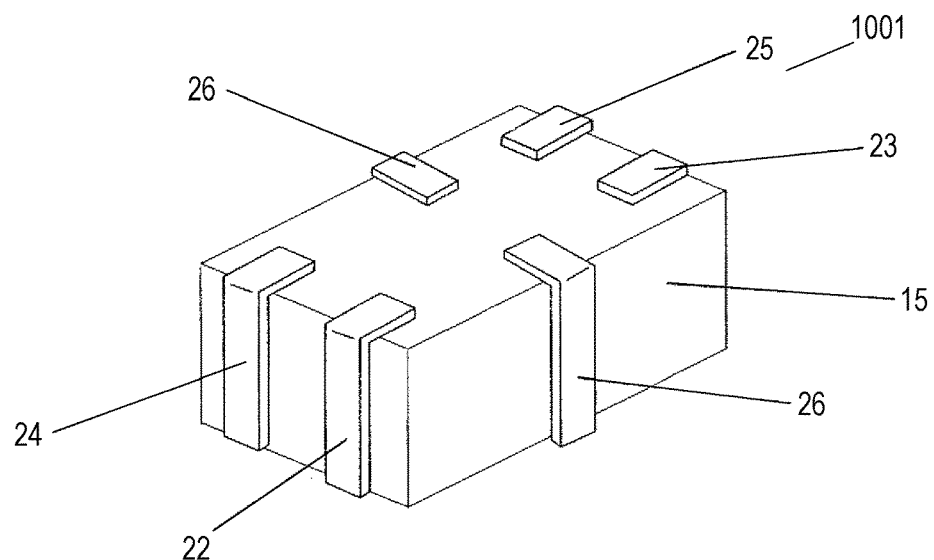
FIG. 2 is a perspective view of the common mode noise filter shown in FIG. 1.

FIG. 1 is an exploded perspective view of common mode noise filter 1001 in accordance with Exemplary Embodiment 1. FIG. 2 is a perspective view of common mode noise filter 1001.

Common mode noise filter 1001, as shown in FIG. 1, includes insulating layers 11a to 11h, coils 12 and 13 provided on upper surfaces of insulating layers 11b to 11e, and metal layer 14 provided on an upper surface of insulating layer 11g. Metal layer 14 is configured to be connected to a ground. Insulating layers 11a to 11h, coil 12, coil 13, and metal layer 14 are stacked to form laminated body 15 shown in FIG. 2.

Coil 12 includes coil conductor 16 with a spiral shape and coil conductor 17 with a spiral shape. Coil conductor 16 is electrically connected in series to coil conductor 17. Coil 13 includes coil conductor 18 with a spiral shape and coil conductor 19 with a spiral shape. Coil conductor 18 is electrically connected in series to coil conductor 19.

Coil conductor 18 is provided between coil conductor 16 and coil conductor 17. Coil conductor 17 is provided between coil conductor 18 and coil conductor 19. Coil conductors 16 to 19 are arranged such that coil conductor 16, coil conductor 18, coil conductor 17, and coil conductor 19 are disposed in this order from above.

Coil conductor 16 is provided on an upper surface of insulating layer 11e. Coil conductor 17 is provided on an upper surface of insulating layer 11c. Coil conductor 18 is provided on an upper surface of 11d of insulating layers. Coil conductor 19 is provided on the upper surface of insulating layer 11b.

That is, coil conductor 16 and coil conductor 17 of coil 12 and coil conductor 18 and coil conductor 19 of coil 13 are disposed alternately.

Coil conductor 16 and coil conductor 18 are magnetically coupled to each other to form common mode filter 20 while coil conductor 17 and the coil conductor 19 are magnetically coupled to each other to form common mode filter 21. Common mode filter 20 is connected in series to common mode filter 21. Metal layer 14 is provided above coil conductor 16.

In common mode noise filter 1001, insulating layers 11a to 11h are stacked in this order from insulating layer 11a. Insulating layers 11b to 11f are made of non-ferromagnetic material, such as paramagnetic materials and nonmagnetic materials. As the nonmagnetic materials, Cu—Zn ferrite, glass ceramics, and the like are practically employed. Insulating layers 11a, 11g, and 11h are made of a ferromagnetic material. As the ferromagnetic material, nickel-Cu—Zn ferrite and the like are practically employed.

As the material of insulating layers 11b to 11f, amorphous glass or crystal glass, which is a nonmagnetic material, is preferably used.

Coil conductors 16 to 19 are made of electrically-conductive material, such as silver, and have spiral shapes formed by plating or printing. A thin film forming method of using sputtering or etching may be employed as another method for forming coil conductors 16 to 19. A spiral coil may be further formed, by plating, on an upper surface of the spiral coil formed by the above thin film forming method.

Coil conductor 16 and a part of coil conductor 18 are located at the same position viewing from above. Coil conductor 16 and coil conductor 18 are wound in the same direction. This configuration causes coil conductor 16 and coil conductor 18 to be magnetically coupled to form common mode filter 20. Similarly, coil conductor 17 and a part of coil conductor 19 are located at the same position viewing from above. Coil conductor 17 and coil conductor 19 are wound in the same direction. This configuration causes coil conductor 17 and coil conductor 19 to be magnetically coupled to form common mode filter 21.

Coil conductor 16 is electrically connected to coil conductor 17 with via-electrodes 12a each formed in respective one of through-holes formed through insulating layers 11d and 11e.

Coil conductor 18 is electrically connected to coil conductor 19 with via-electrodes 13a each formed in respective one of through-holes formed through insulating layers 11c and 11d.

Two via-electrodes 12a provided in insulating layers 11d and 11e are provided at the same position viewing from above. Two via-electrodes 13a formed in insulating layers 11c and 11d are located at the same position viewing from above. Via-electrodes 12a and 13a are formed by drilling predetermined portions on insulating layers 11d, 11e, 11c, and 11d by using laser to form the through-holes, and then filling these through-holes with electric conductive material, such as silver.

Metal layer 14 is made of a metallic material, such as silver or a silver palladium alloy, and formed continuously by printing, plating, or sticking metallic foil on the upper surface of insulating layer 11g.

Metal layer 14 is disposed above coil conductor 16 that is located uppermost among coil conductors 16 to 19. Metal layer 14 faces coil 12 out of coils 12 and 13, and faces coil conductor 16 out of coil conductors 16 and 17 rather than the entirety of coil 12.

Coil conductor 16 may face not an entire of metal layer 14 but may face a part of metal layer 14 viewing from above. The area of a portion of coil conductor 16 facing metal layer 14 viewing from above can be adjusted by adjusting a width and a length of coil conductor 16. The area of the portion of coil conductor 16 facing metal layer 14 is adjusted to control a capacitive component generated between coil conductor 16 and metal layer 14. The area of the portion of coil conductor 16 facing metal layer 14 may be adjusted by changing the area of metal layer 14.

The sum of the lengths of coil conductors 16 and 17 is preferably substantially equal to the sum of the lengths of coil conductors 18 and 19. This configuration improves a balance of differential signals, and thus, prevents the loss of differential signals from increasing. In this case, the difference between the lengths of coil conductors 16 and 17 is adjusted as to adjust the area of the portion of coil conductor 16 facing metal layer 14, thereby controlling the capacitive component generated between coil conductor 16 and metal layer 14.

Insulating layers 11h and 11f are made of magnetic material, and are provided on upper and lower surfaces of metal layer 14 shown in FIG. 1. The magnetic material may not necessarily be provided on the upper and lower surfaces of metal layer 14.

The number of insulating layers 11a to 11h which are laminated is not limited to the number of sheets shown in FIG. 1. Besides, insulating layers 11a to 11h may be made of the same material.

Laminated body 15 shown in FIG. 2 is thus formed. External electrodes 22 to 25 are provided on edge surfaces of laminated body 15 opposite to each other, and are electrically connected to coil conductors 16 to 19, respectively. External electrodes 26 electrically connected to metal layer 14 are provided on edge surfaces of laminated body 15 opposite to each other. Metal layer 14 is connected to external electrodes 26 via lead electrodes 14a.

External electrodes 22 to 26 are formed by applying silver on edge surfaces and side surfaces of laminated body 15 by printing. A nickel layer may be formed on a surface of the silver by plating. Then, metal, such as tin or solder material, with a low melting point may be formed on a surface of the nickel layer by plating.

Figure 3:
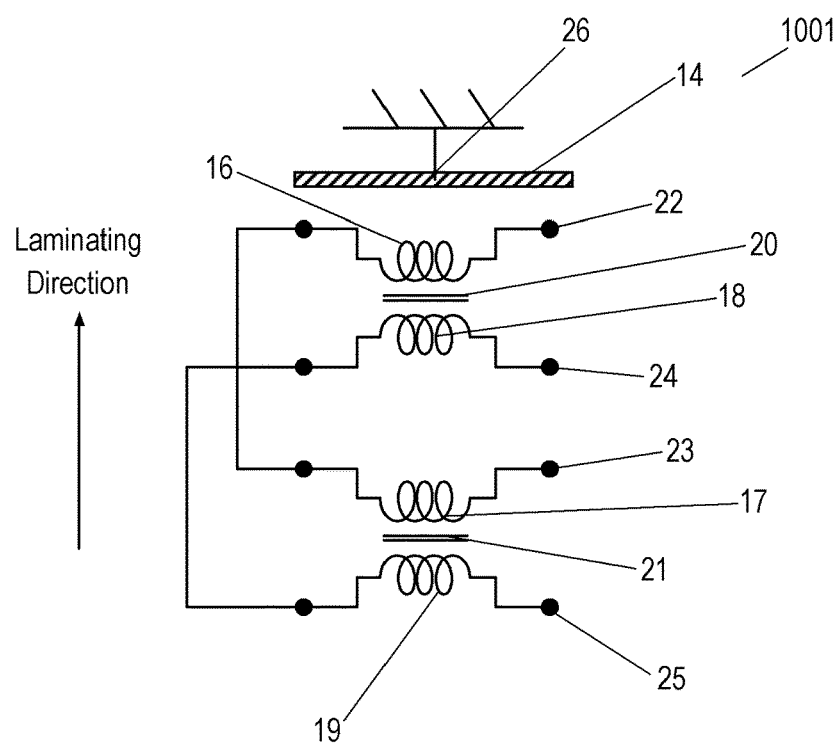
FIG. 3 is a schematic circuit diagram of the common mode noise filter shown in FIG. 1.

FIG. 3 is a schematic circuit diagram of common mode noise filter 1001 in accordance with Embodiment 1.

As described above, in common mode noise filter 1001, coil 12 includes coil conductor 16 with a spiral shape and coil conductor 17 with a spiral shape. Coil 13 includes coil conductor 18 with a spiral shape and coil conductor 19 with a spiral shape. Coil conductors 16 and 18 are magnetically coupled to each other to form common mode filter 20. Coil conductors 17 and 19 are magnetically coupled to each other to form common mode filter 21. Common mode filter 20 is connected in series to common mode filter 21. Coil conductors 16 to 19 are arranged such that coil conductor 16, coil conductor 18, coil conductor 17, and coil conductor 19 are arranged in this order from above.

Metal layer 14 disposed above coil conductor 16 that is located uppermost among coil conductors 16 to 19 can attenuate a common mode noise in a wide frequency range upon having the common mode noise enter thereto. A capacitive component generated mainly between coil conductor 16 and metal layer 14 connected to the ground, rather than the entirety of coil 12, substantially without generating a capacitive component between coil conductor 17 and metal layer 14, thereby generating two attenuation poles.

In conventional common mode noise filter 500 shown in FIG. 16, common mode filters 6 and 7 function as an inductor upon having a common mode noise enter thereto. An impedance of the inductor increases as a frequency increases. This causes a voltage difference between input and output parts of common mode noise filter 500, and generates a stray capacitance between the input and output parts, thereby causing a self-parallel resonance.

Unlike conventional common mode noise filter 500, in common mode noise filter 1001 according to Embodiment 1, common mode filters 20 and 21 function as an inductor, and remove a common mode noise. As a frequency increases, the impedance decreases due to the capacitive component between coil conductor 16 and metal layer 14, and prevents a voltage difference between input and output parts of common mode noise filter 1001 from extremely increasing. Furthermore, if a stray capacitance is not generated between the input and output parts of coils 12 and 13, self-parallel resonance frequency thereof increases.

In common mode noise filter 1001 according to Embodiment 1, a common mode noise may bypassed to a ground through the capacitive component between coil conductor 16 and metal layer 14, thereby attenuating a common mode noise in a wide frequency range.

On the other hand, in the case where no metal layer 14 is provided, impedance of coils 12 and 13 increases at self-parallel resonance of coils 12 and 13, thus generating a large voltage difference between an output part of coil 12 and the ground. The voltage difference and the capacitive component generated by metal layer 14 connected to the ground cause a series resonance between the output part of coil 12 and the ground simultaneously to the self-parallel resonance.

In common mode noise filter 1001 according to Embodiment 1, a small capacitance is generated only between metal layer 14 and coil conductor 16. Besides, no capacitance is generated between metal layer 14 and coil conductor 17. This configuration prevents a series resonance from being generated between coil conductor 17 and the ground at the time of the self-parallel resonance of coils 12 and 13. This allows the self-parallel resonance of coils 12 and 13 to be separated from the series resonance caused by the capacitance between coil conductor 16 and the ground, and to be adjusted. Therefore, two attenuation poles are obtained in frequency characteristic of attenuation of a common mode noise. As a result, a common mode noise can be attenuated in a wide frequency range.

Common mode noise filter 1001 according to Embodiment 1 will be detailed below.

Figure 4:
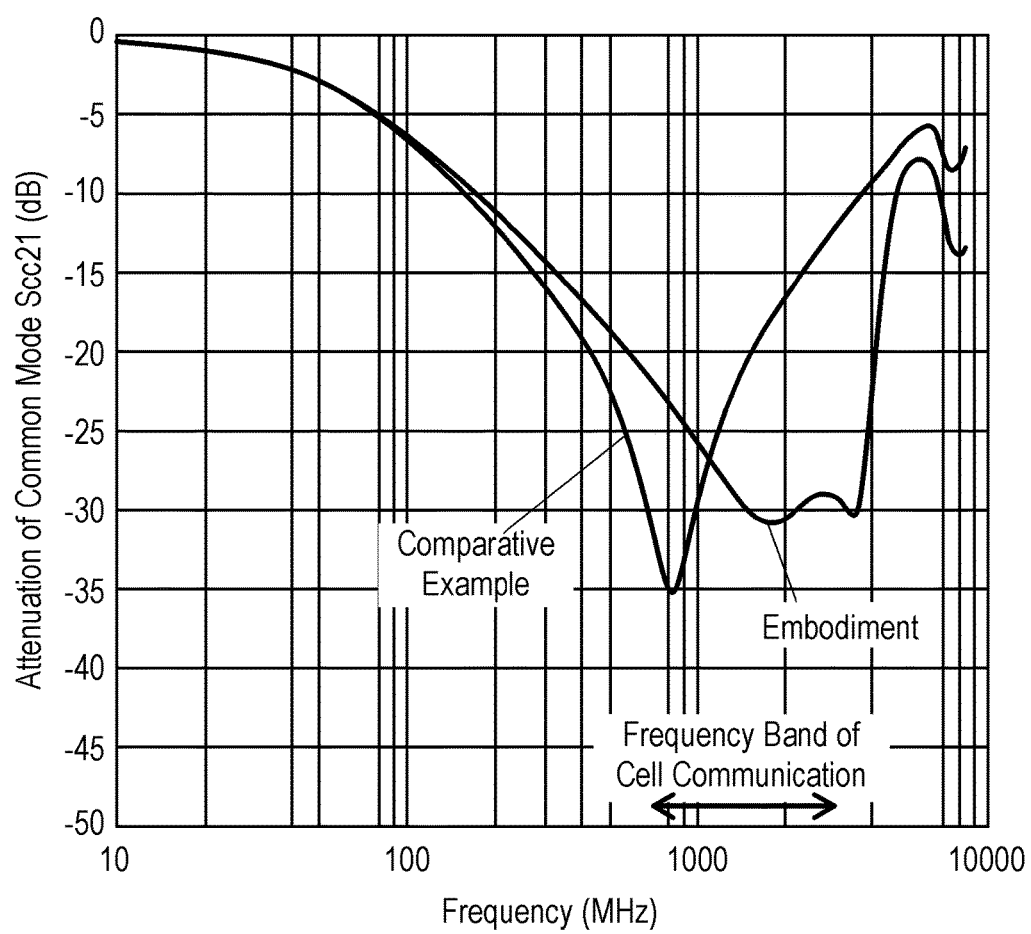
FIG. 4 shows a comparison between common-mode-noise attenuation characteristics of the common mode noise filter shown in FIG. 1 and a conventional common mode noise filter.

FIG. 4 shows a comparison of attenuation characteristics of common mode noise of the common mode noise filter according to Embodiment 1 shown in FIG. 1 and the conventional common mode noise filter in FIG. 16 as a comparative example.

As shown in FIG. 4, the common mode noise filter according to the embodiment can attenuate a common mode noise in a high frequency region more than the comparative example of the common mode noise filter, and can attenuate a common mode noise in a wide frequency range from 700 MHz to 3 GHz, which serves as a communication frequency band of a cellular wireless system. As for attenuation characteristics of common mode noise shown in FIG. 4, coils 2 and 3 the comparative example of the common mode noise filter have a self-resonance frequency of about 800 MHz.

Coils 12 and 13 of the common mode noise filter according to the embodiment have a self-resonance frequency of about 2 GHz. Therefore, the common mode noise filter according to the embodiment can attenuate a common mode noise by functioning as an inductor. The common mode noise filter according to the embodiment exhibits a high attenuation ability of common mode noise up to about 3 GHz. This is because the capacitive component between metal layer 14 and coil conductor 16 bypasses a common mode noise to the ground up to a resonance frequency band.

Accordingly, a capacitive component is generated between coil conductor 16 and metal layer 14 connected to the ground, rather than the entirety of coil 12, and thus the common mode noise filter according to the embodiment functions as an inductor upon having a common mode noise enter thereto. Therefore, by shifting the self-resonance frequency to a high frequency region, attenuation characteristics of common mode noise are improved. Besides, in the high frequency region, the above bypass effect, i.e., bypassing a common mode noise to the ground, provides the attenuation characteristics.

The ratio of a length of coil conductor 16 to a total length of coil 12 can be changed depending on desired characteristics. That is, an area of a portion of coil 12 facing metal layer 14 connected to the ground can be adjusted to control the capacitive component between coil 12 and metal layer 14, thereby adjusting a frequency of a attenuation pole of common mode noise.

When differential mode digital signals enter, magnetic fields generated by coils 12 and 13 are canceled and do not increase the impedance thereof, hence causing no voltage difference between coils 12 and 13. Accordingly, coils 12 and 13 function as a transmission path with a small loss. This configuration prevents a resonance between metal layer 14 and each of coils 12 and 13, and allows common mode noise filter 1001 to maintain quality of the differential digital signals without deteriorating the differential digital signals.

The distance between coil conductor 16 and metal layer 14 can be adjusted to change a capacitive component. Alternatively, lengths of coil conductors 16 to 19 can be changed to adjust a series resonance frequency between coil conductor 16 and the ground or a self-parallel resonance frequency of coils 12 and 13. In this case, if the resonance frequency of coil 12 is close to or identical to the resonance frequency of coil 13, a large amount of attenuation is provided at a particular frequency.

Static-electricity passing parts 27a and 27b may be formed between external electrodes 22 to 25 and metal layer 14. Static-electricity passing parts 27a and 27b pass electricity when a voltage equal to or higher than a predetermined value is applied, and function as an insulator when a voltage lower than the predetermined value is applied. This configuration allows common mode noise filter 1001 not only to attenuate a common mode noise, but also to protect electronic devices from overvoltage even if an overvoltage is applied to the electronic devices.

Figure 5:
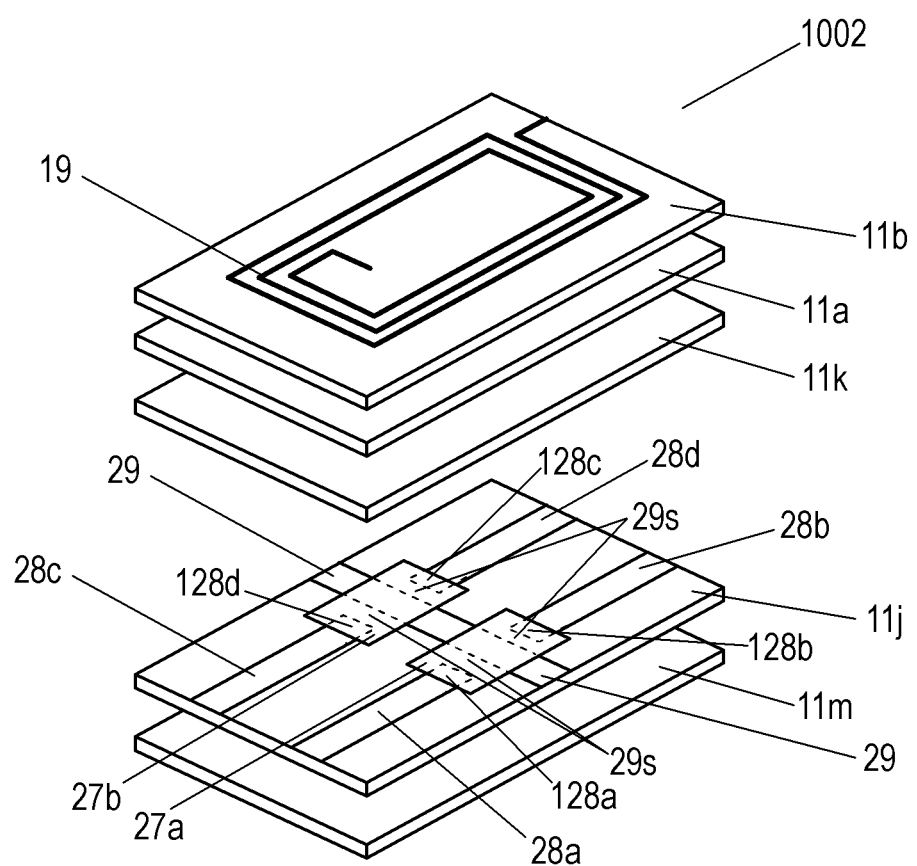
FIG. 5 is an exploded perspective view of another common mode noise filter in accordance with Embodiment 1.

FIG. 5 is an exploded perspective view of another common mode noise filter 1002 according to Embodiment 1 in which static-electricity passing parts 27a and 27b are provided below insulating layer 11a. In FIG. 5, components identical to those of common mode noise filter 1001 shown in FIG. 1 are denoted by the same reference numerals. For simplifying the description, a structure of the filter above insulating layer 11b are omitted in FIG. 5. External electrodes 22 to 26 shown in FIG. 2 are provided at the same position while FIG. 5 does not show the electrodes.

Common mode noise filter 1002 shown in FIG. 5 includes static-electricity electrodes 28a to 28d connected to external electrodes 22 to 25, respectively. Static-electricity electrodes 28a to 28d are provided on insulating layer 11j. Insulating layer 11j is provided below insulating layer 11a and made of nonmagnetic material. Common mode noise filter 1002 further includes static-electricity electrode 29 connected to external electrode 26. Tip ends 128a and 128b of static-electricity electrodes 28a and 28b opposite to portions of static-electricity electrodes 28a and 28b connected to external electrodes 22 and 23 are formed in static-electricity passing part 27a. Tip ends 128c and 128d of static-electricity electrodes 28c and 28d opposite to of portions of static-electricity electrodes 28c and 28d connected to external electrodes 24 and 25 are formed in static-electricity passing part 27b. Tip ends 128a and 128b of static-electricity electrodes 28a and 28b extend to between static-electricity passing part 27a and insulating layer 11j and blow static-electricity passing part 27a. Tip ends 128c and 128d of static-electricity electrodes 28c and 28d extend to between static-electricity passing part 27b and insulating layer 11j and below static-electricity passing part 27b. Thus, static-electricity electrodes 28a and 28b contact static-electricity passing part 27a with a large area while static-electricity electrodes 28c and 28d contact static-electricity passing part 27b with a large area. Static-electricity electrode 29 extends on a straight line from one side of insulating layer 11j to another side of insulating layer 11j opposite to the one side of insulating layer 11j while contacting lower surfaces of static-electricity passing parts 27a and 27b. Each of gaps 29s is provided between tip ends 128a to 128d of static-electricity electrodes 28a to 28d and static-electricity electrode 29.

That is, static-electricity electrode 28a is electrically connected to coil conductor 16 via external electrode 22. Similarly, static-electricity electrode 28b is electrically connected to coil conductor 17. Static-electricity electrode 28c is electrically connected to coil conductor 18. Static-electricity electrode 28d is electrically connected to coil conductor 19. Lead electrode 14a of metal layer 14 is electrically connected to static-electricity electrode 29 via external electrode 26. External electrode 26 is electrically connected to static-electricity passing parts 27a and 27b via static-electricity electrode 29. Accordingly, static-electricity passing part 27a is provided between external electrode 22 and external electrode 23 and connected to electrodes 22 and 23 while static-electricity passing part 27b is provided between external electrode 24 and external electrode 25 and connected to electrodes 24 and 25.

Coil 12, static-electricity passing part 27a, and static-electricity passing part 27b are connected in parallel to one another between external electrodes 22 and 23. When a voltage equal to or higher than a predetermined value as an overvoltage is applied to external electrode 22 or 23, a current flows from static-electricity passing part 27a to the ground via external electrode 26. Similarly, regarding external electrodes 24 and 25, when a voltage equal to or higher than a predetermined as an overvoltage is applied to external electrode 24 or 25, a current flows from static-electricity passing part 27b to the ground via external electrode 26.

Insulating layer 11k made of nonmagnetic material is provided on upper surfaces of static-electricity electrodes 28a to 28d and static-electricity electrode 29, thus causing static-electricity electrodes 28a to 28d and static-electricity electrode 29 to be provided between nonmagnetic materials. Insulating layer 11m made of magnetic material is formed on a lower surface of insulating layer 11j.

Static-electricity passing parts 27a and 27b are formed by applying a voltage-dependent resistance material with a resistance changing depending on a voltage applied thereto on insulating layer 11j by, e.g. printing. The voltage-dependent resistance material may employ a varistor material, such as ceramic material mainly containing zinc oxide, or metallic material containing at least one of aluminum, nickel, and copper, or resin material containing at least one of silicon, epoxy, and phenol.

Static-electricity electrodes 28a to 28d and 29 are made of metallic material, such as silver or silver palladium alloy, and are formed to have plate shapes on an upper surface of insulating layer 11j by, e.g. printing, plating, or sticking metallic foil constituted by the above metallic materials.

In the above configuration, coil conductors 16 to 19 are provided between metal layer 14 made of metal with a plate shape and each of static-electricity electrodes 28a to 28d and 29 made of metal with plate shapes. This configuration reduces a total density deviation of laminated body 15 more than, e.g. a configuration in which a metal with a plate shape is provided only above coil conductor 16 or 19.

Static-electricity electrode 29 connected to external electrode 26 configured to be connected to the ground may be used as metal layer 14 of common mode noise filter 1001 shown in FIG. 1, thereby providing the filter with a low profile. This configuration exhibits an effect that stray capacitances between coils 12 and 13, static-electricity electrodes 28a to 28d, and static-electricity electrode 29 can attenuate a common mode noise.

Static-electricity passing parts 27a and 27b, static-electricity electrodes 28a to 28d, and static-electricity electrode 29 are not necessarily be provided below insulating layer 11a, but may be provided between, e.g. metal layer 14 and coil conductor 16.

Static-electricity passing parts 27a and 27b may be implemented by a space instead of the voltage-dependent resistance material. All or a part of static-electricity electrodes 28a to 28d and static-electricity electrode 29 may be provided on different layers. A further metal layer connected to external electrodes 22 to 25 is provided on an upper surface of insulating layer 11g on which metal layer 14 is formed. A gap may be formed between the further metal layer and metal layer 14. A further metal layer connected to external electrode 26 is provided close to coil conductors 16 to 19, and a gap may be formed between the further metal layer and each of coil conductors 16 to 19. The above gaps may be used as static-electricity passing parts 27a and 27b.

In common mode noise filter 1001 according to Embodiment 1, metal layer 14 is provided above coil conductor 16 located uppermost among coil conductors 16 to 19, but may be provided below coil conductor 19 that is located lowermost among coil conductors 16 to 19.

Exemplary Embodiment 2

Figure 6:
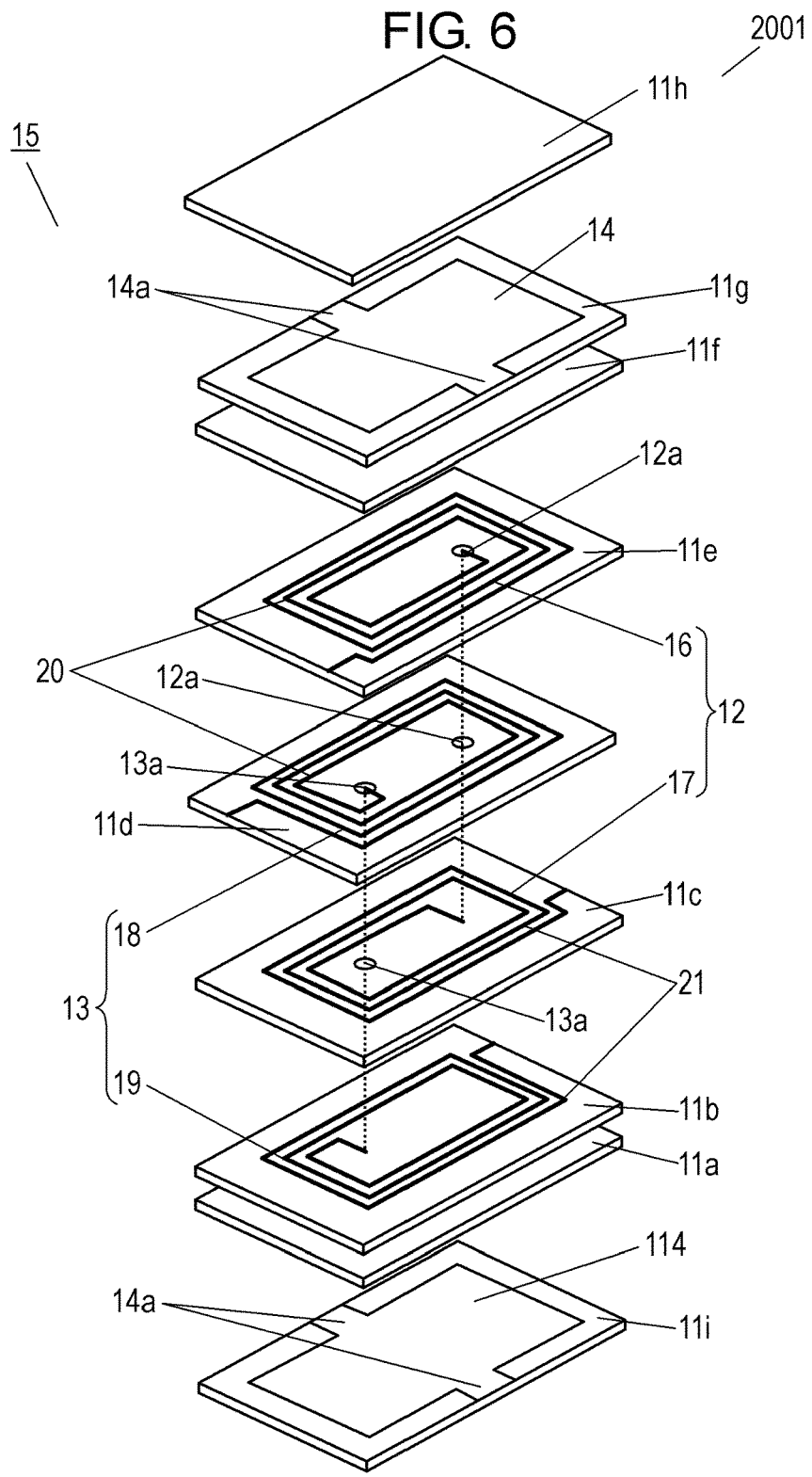
FIG. 6 is an exploded perspective view of a common mode noise filter in accordance with Exemplary Embodiment 2.

FIG. 6 is an exploded perspective view of common mode noise filter 2001 in accordance with Exemplary Embodiment 2. In the description of the common mode noise filter according to Embodiment 2, components identical to those of the common mode noise filter according to Embodiment 1 are denoted by the same reference numerals.

Unlike common mode noise filter 1001 according to Embodiment 1 shown in FIG. 1, common mode noise filter 2001 according to Embodiment 2 further includes metal layer 114 disposed below coil conductor 19 that is located lowermost among coil conductors 16 to 19, as shown in FIG. 6.

Metal layer 114 is provided on an upper surface of insulating layer 11i. Thus, metal layer 14 faces only coil 12 out of coils 12 and 13, i.e., does not face coil 13. Metal layer 114 faces only coil 13 out of coils 12 and 13, i.e., does not face coil 12. Metal layers 14 and 114 face coil conductors 16 and 19, respectively, rather than the entirety of coils 12 and 13.

Figure 7:
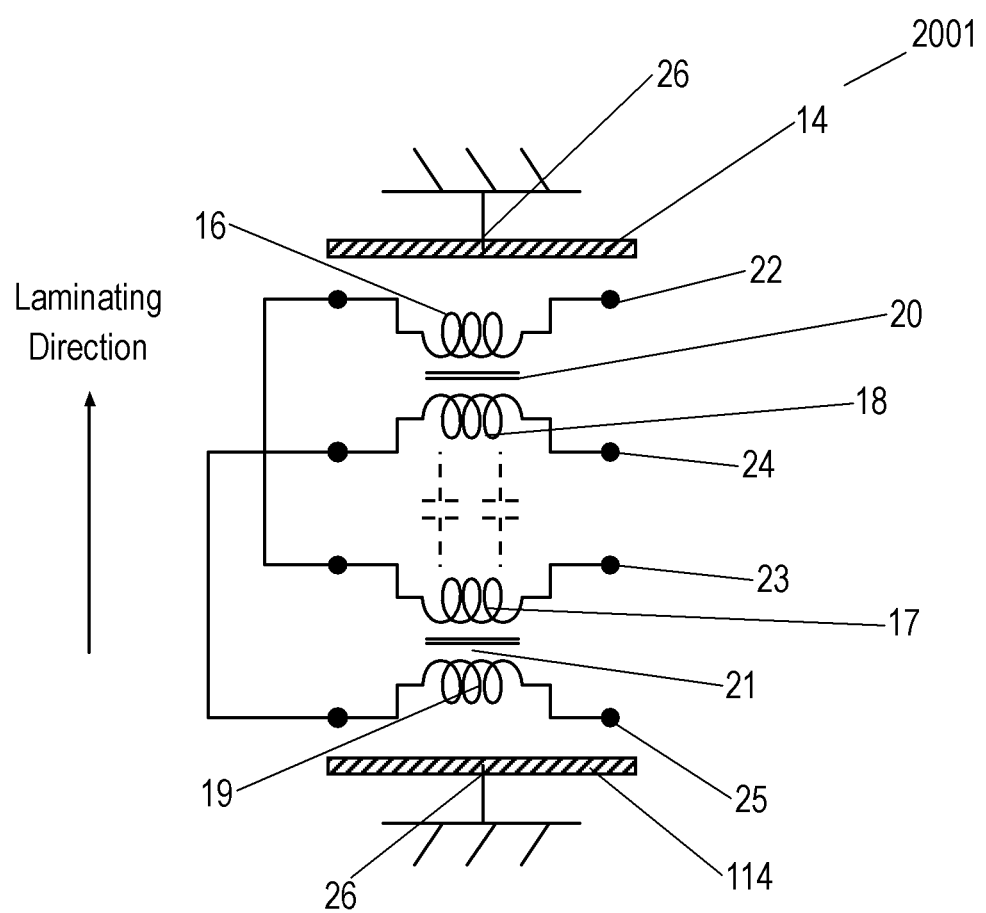
FIG. 7 is a schematic circuit diagram of the common mode noise filter shown in FIG. 6.

FIG. 7 is a schematic circuit diagram of common mode noise filter 2001 according to Embodiment 2.

Figure 8:
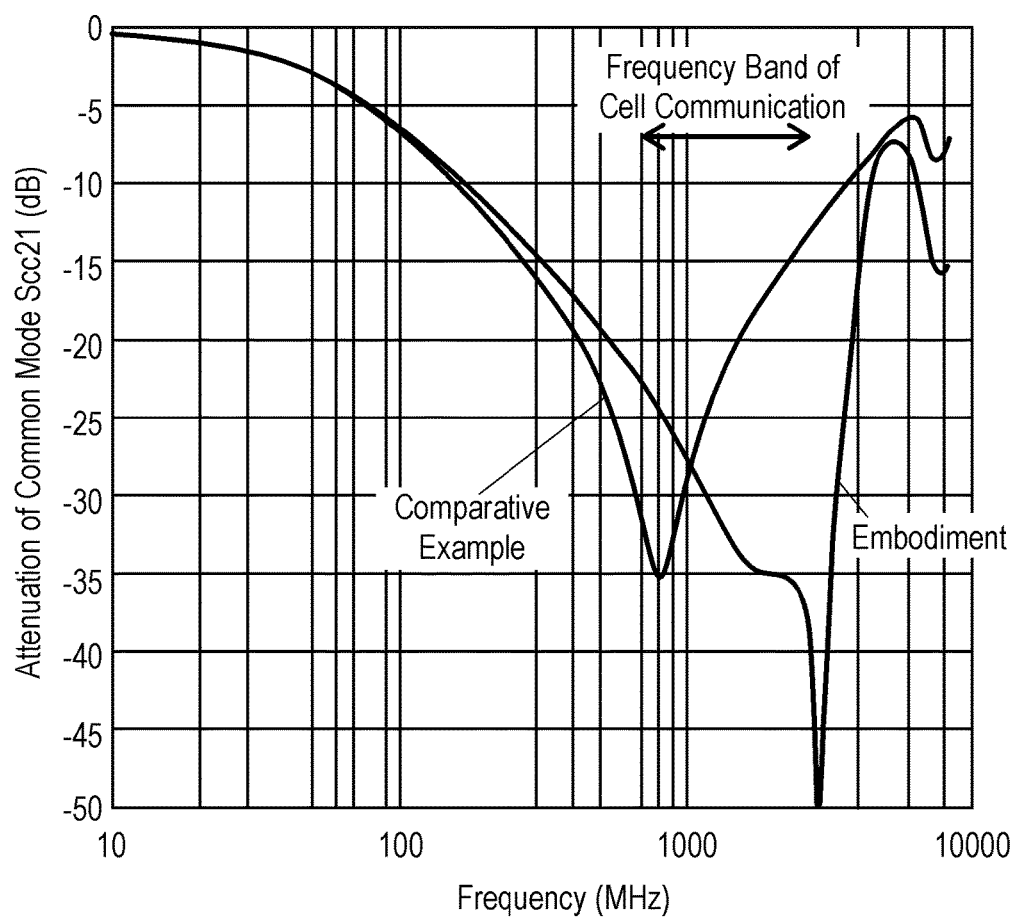
FIG. 8 shows a comparison between common-mode-noise attenuation characteristics of the common mode noise filter shown in FIG. 6 and the conventional common mode noise filter.

FIG. 8 shows a comparison of common-mode-noise attenuation characteristics of common mode noise filter 2001 according to Embodiment 2 shown in FIG. 6 and conventional common mode noise filter 500 shown in FIG. 16 as a comparative example.

As shown in FIG. 8, the common mode noise filter according to the embodiment can attenuate a common mode noise in a high frequency region more than the comparative example of the common mode noise filter, thus providing a large amount of attenuation of common mode noise in a high frequency region.

In the common mode noise filter according to the embodiment, an amount of attenuation of common mode noise increases in a high frequency region since stray capacitances are generated between coil conductor 16 and metal layer 14, and between coil conductor 19 and metal layer 114.

In the comparative example of the common mode noise filter, a signal passing through coil 3 and a signal passing through coil 2 are imbalanced due to a stray capacitance between coil conductors 5a and 4b, hence causing differential signals passing through coil conductors 5a and 4b to deteriorate. Therefore, the balance of the differential mode signals may deteriorate in each of common mode filter 7 and common mode filter 6.

Figure 9:
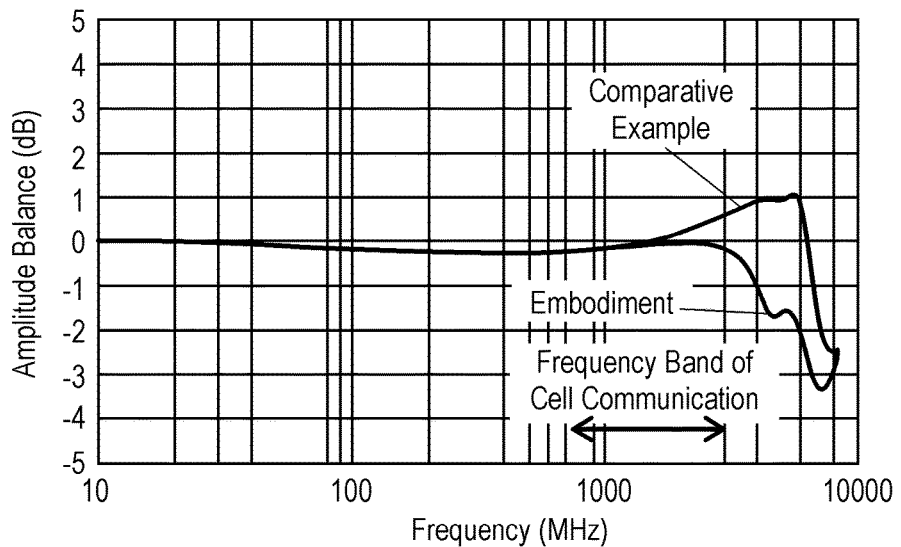
FIG. 9 shows a comparison of amplitude balance of differential signals of the common mode noise filter shown in FIG. 6 and the conventional common mode noise filter.

FIG. 9 shows a comparison of f amplitude balance of differential mode signals of the common mode noise filter according to Embodiment 2 shown in FIG. 6 and the comparative example of the conventional common mode noise filter shown in FIG. 16.

Figure 10:
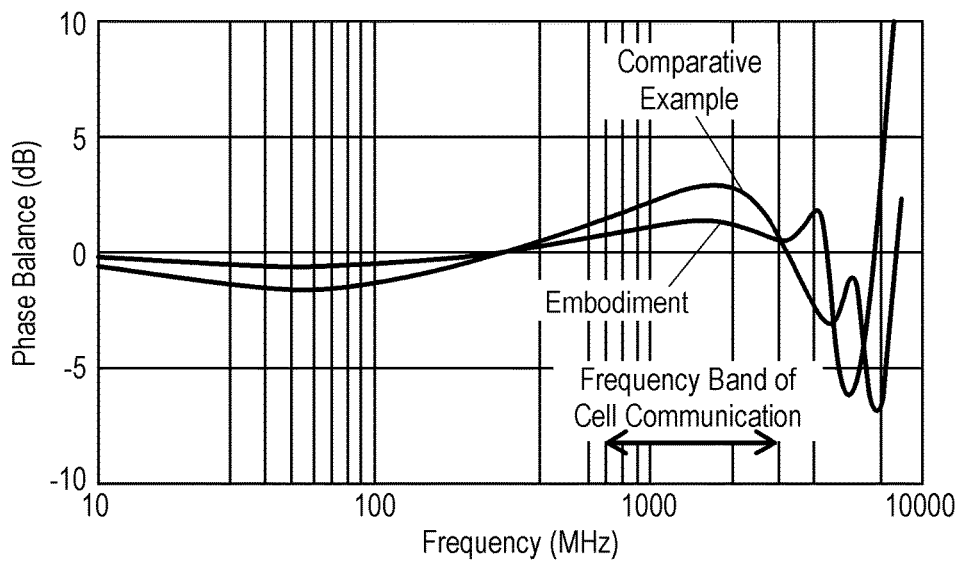
FIG. 10 shows a comparison of a phase balance of differential signals of the common mode noise filter shown in FIG. 6 and the conventional common mode noise filter.
Figure 11:
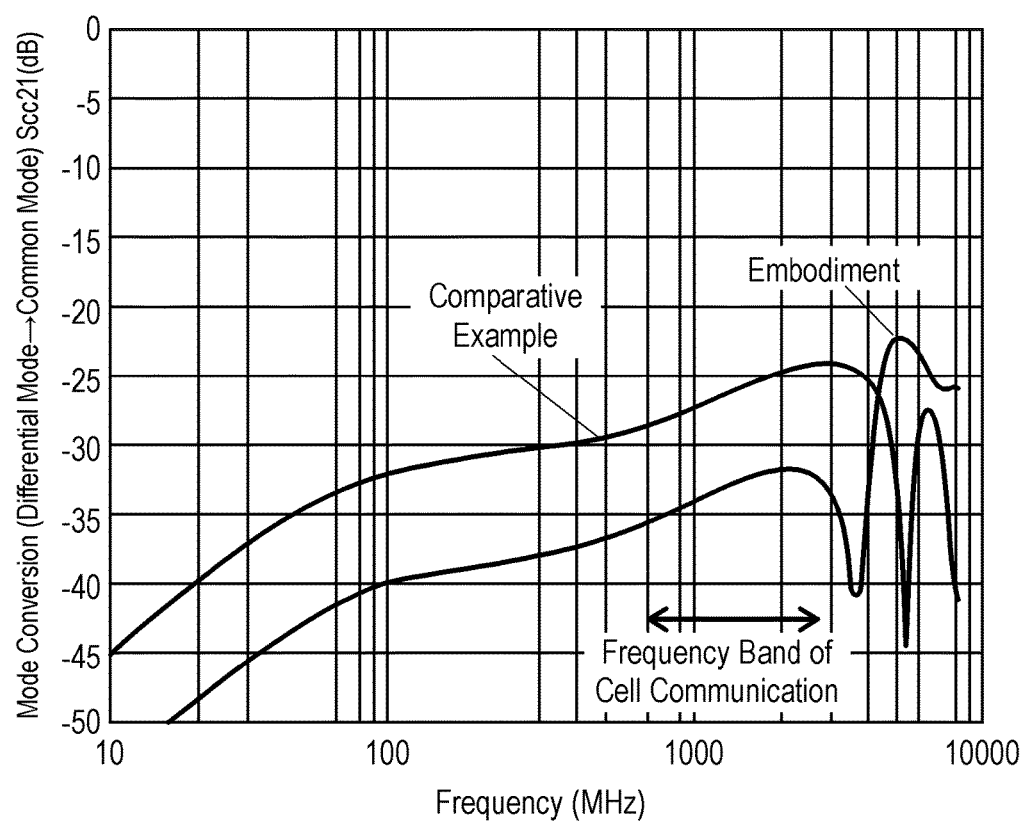
FIG. 11 shows a comparison of mode conversion characteristics of the common mode noise filter shown in FIG. 6 and the conventional common mode noise filter.

FIG. 10 shows a comparison of phase balance of the differential signals of the common mode noise filter according to the embodiment and the comparative example. FIG. 11 shows a comparison of mode conversion characteristics of the filters. The amplitude balance and the phase balance here will be described. An amplitude and a phase of differential signals before the signals are input into the common mode noise filter change to an amplitude and a phase of the differential signals after the signals are output from the common mode noise filter by a difference. The difference of zero corresponds to an ideal state. The closer to the ideal state, the higher the quality of the differential signals are.

As shown in FIGS. 9 to 11, in the common mode noise filter according to the embodiment, the amplitude balance and the phase balance of differential mode signals are better than the comparative example of the common mode noise filter. A deteriorating component (component caused by imbalance of differential signals) of the comparative example compared to the common mode noise filter according to the embodiment is converted into a common mode component. That is, when differential signals pass through the comparative example of the common mode filter, a common mode noise may be generated. Particularly, a mobile terminal of a cellular wireless system, such as a smart phone, uses a communication frequency band from 700 MHz to 3 GHz. If the differential signals have a frequency component from 700 MHz to 3 GHz, the differential signals partially are converted into a common mode noise with a frequency within a range from 700 MHz to 3 GHz. The common mode noise causes the mobile terminal of a cellular system to deteriorate a receiving sensitivity of its wireless section.

On the other hand, in the common mode noise filter according to the embodiment, metal layers 14 and 114 face coil conductors 16 and 19 which does not a stray capacitance between metal layers 14 and 114 and coil conductors 16 and 19. Thus, capacitances between metal layers 14 and 114 and coil conductors 16 and 19 are so small that the amplitude balance and phase balance of the differential signals flowing through coil conductors 16 and 19 can be adjusted to be the ideal state. The common mode noise filter according to the embodiment can thus adjust the balance of differential mode signals, thereby preventing the mode conversion and reducing a common mode noise. As shown in FIG. 9 and FIG. 10, at communication frequency band from 700 MHz to 3 GHz for a cellular wireless system, the common mode noise filter according to the embodiment is superior to the comparative example of the common mode noise filter in the amplitude balance and the phase balance of differential signals, and prevents the mode conversion.

In the example of common mode noise filter 1001 according to Embodiment 1, since a capacitance is generated only between coil conductor 16 and metal layer 14, common mode filter 20 is improved in the balance of differential mode signals. On the other hand, in common mode noise filter 2001 according to Embodiment 2, both common mode filters 20 and 21 are improved in the balance of differential mode signals. Therefore, common mode noise filter 2001 is more preferable than common mode noise filter 1001 according to Embodiment 1.

In Embodiments 1 and 2, the distance between coil conductor 18 and coil conductor 17 may be longer than the distance between coil conductor 16 and coil conductor 18 and the distance between coil conductor 17 and coil conductor 19. This configuration decreases a stray capacitance between coil conductors 18 and 17 when differential (differential mode) signals pass through the filter, thereby reducing the mode conversion. Accordingly, deterioration of a differential (differential mode) signal can be previously reduced, and the capacitance may be controlled easily by metal layer 14. The distance between coil conductor 18 and coil conductor 16 which faces metal layer 14 is large, and reduces magnetic coupling between coil conductor 16 and coil conductor 18 accordingly. The distance between coil conductor 17 and coil conductor 19 is large, and reduces magnetic coupling between coil conductor 17 and coil conductor 19 accordingly. Therefore, self-parallel resonance frequency of coil 12 and coil 13 which are magnetically coupled can be adjusted, thereby controlling common-mode-noise rejection performance in a wide frequency range easily.

Exemplary Embodiment 3

Figure 12:
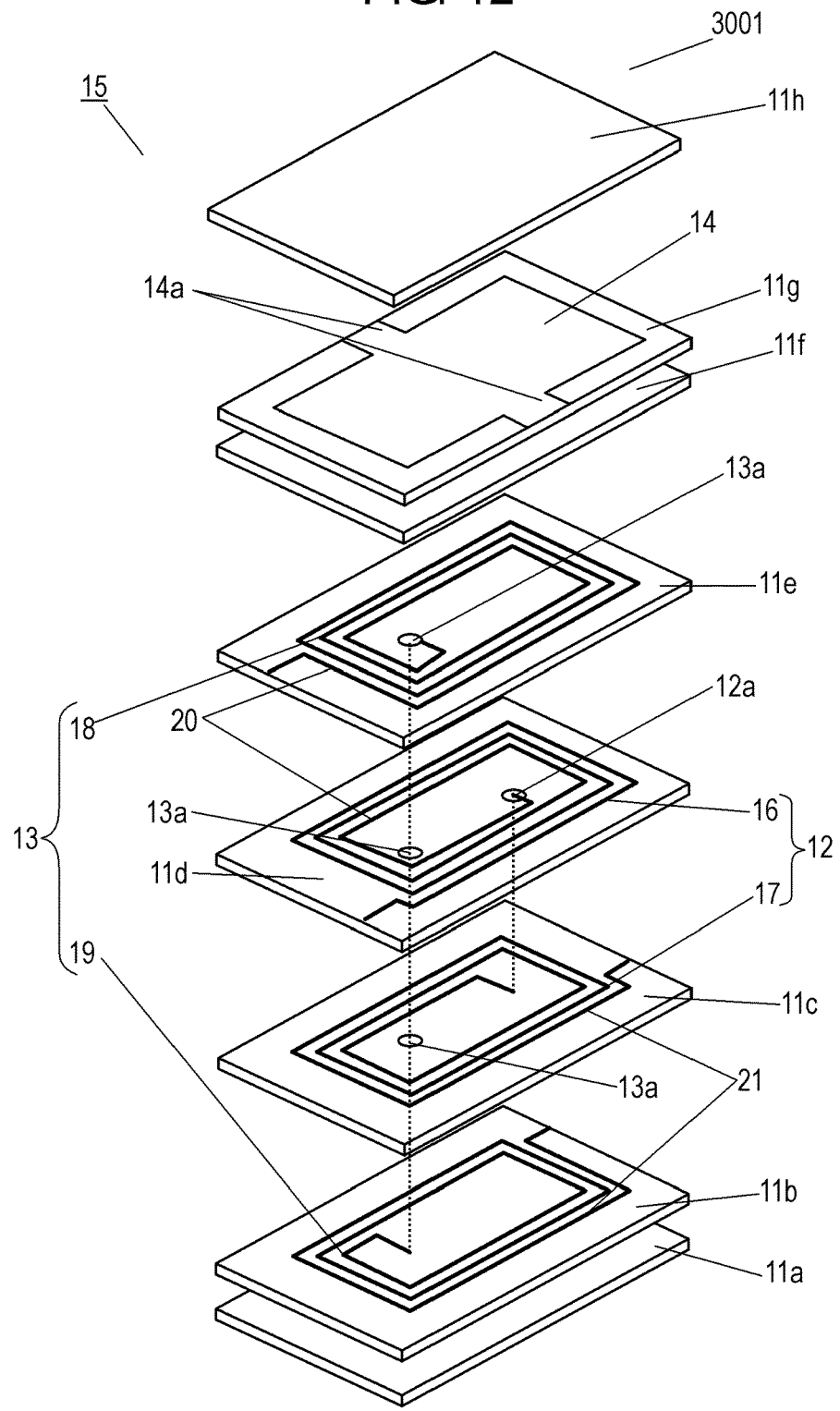
FIG. 12 is an exploded perspective view of a common mode noise filter in accordance with Exemplary Embodiment 3.

FIG. 12 is an exploded perspective view of common mode noise filter 3001 in accordance with Exemplary Embodiment 3. In accordance with Embodiment 3, components identical to those of the common mode noise filters according to Embodiments 1 and 2 are denoted by the same reference numerals, and their description may be omitted.

Unlike common mode noise filter 1001 according to Embodiment 1, in common mode noise filter 3001 according to Embodiment 3, coil conductor 16 and coil conductor 17 which constitute coil 12 are disposed between coil conductor 18 and coil conductor 19 which constitute coil 13, as shown in FIG. 12.

Figure 13:
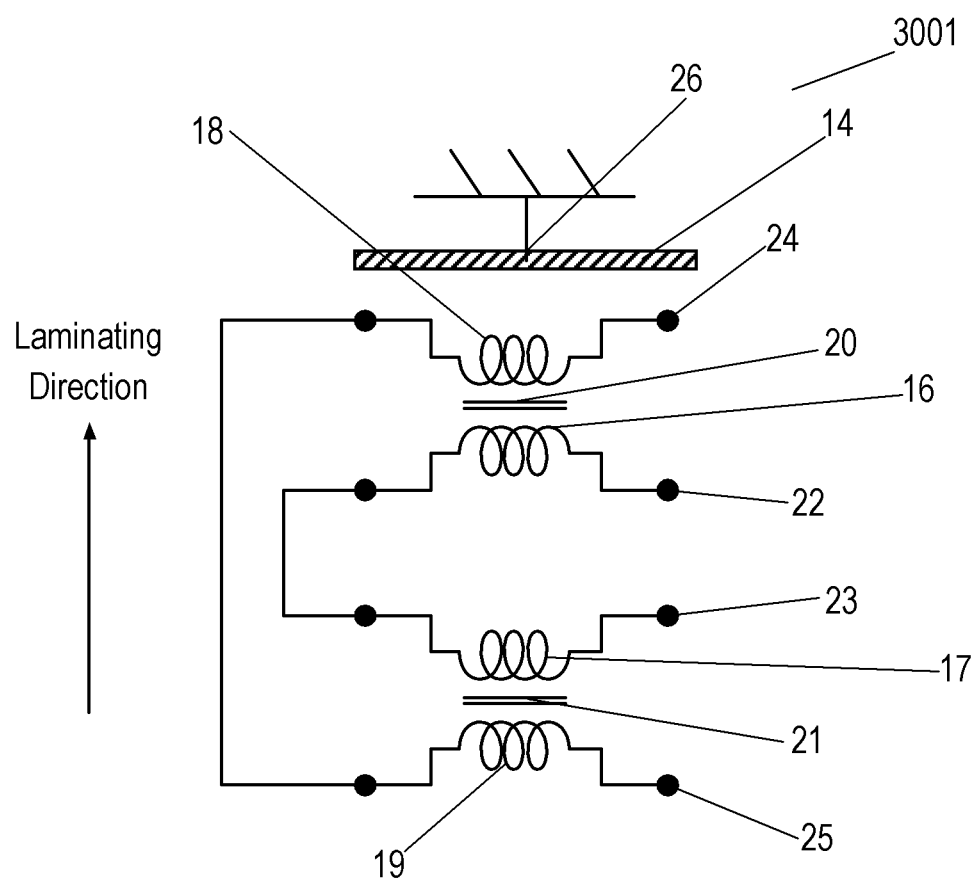
FIG. 13 is a schematic circuit diagram of the common mode noise filter shown in FIG. 12.

FIG. 13 is a schematic circuit diagram of common mode noise filter 3001 according to Embodiment 3.

Common mode noise filter 3001 according to Embodiment 3 can attenuate a common mode noise in a high frequency region more than conventional common mode noise filter 500, similarly to common mode noise filter 1001 according to Embodiment 1. When a differential signal enters, no stray capacitance is generated between coil conductor 16 and coil conductor 17 since coil conductor 16 and coil conductor 17 have the same electric potential. This configuration prevents deterioration of the differential signal due to reduction of characteristic impedance in a differential mode.

Common mode noise filter 3001 according to Embodiment 3 may further include metal layer 114 disposed below coil conductor 19 that is located lowermost, similarly to common mode noise filter 2001 according to Embodiment 2.

The distance between coil conductor 16 and coil conductor 17 may be longer than the distance between coil conductor 16 and coil conductor 18 and the distance between coil conductor 17 and coil conductor 19. This configuration weakens the magnetic coupling between common mode filters 21 and 22, and allows self-parallel resonance frequency of coil 12 and coil 13 which are magnetically coupled to be adjusted, thereby controlling common-mode-noise rejection performance in a wide frequency range easily.

Exemplary Embodiment 4

Figure 14:
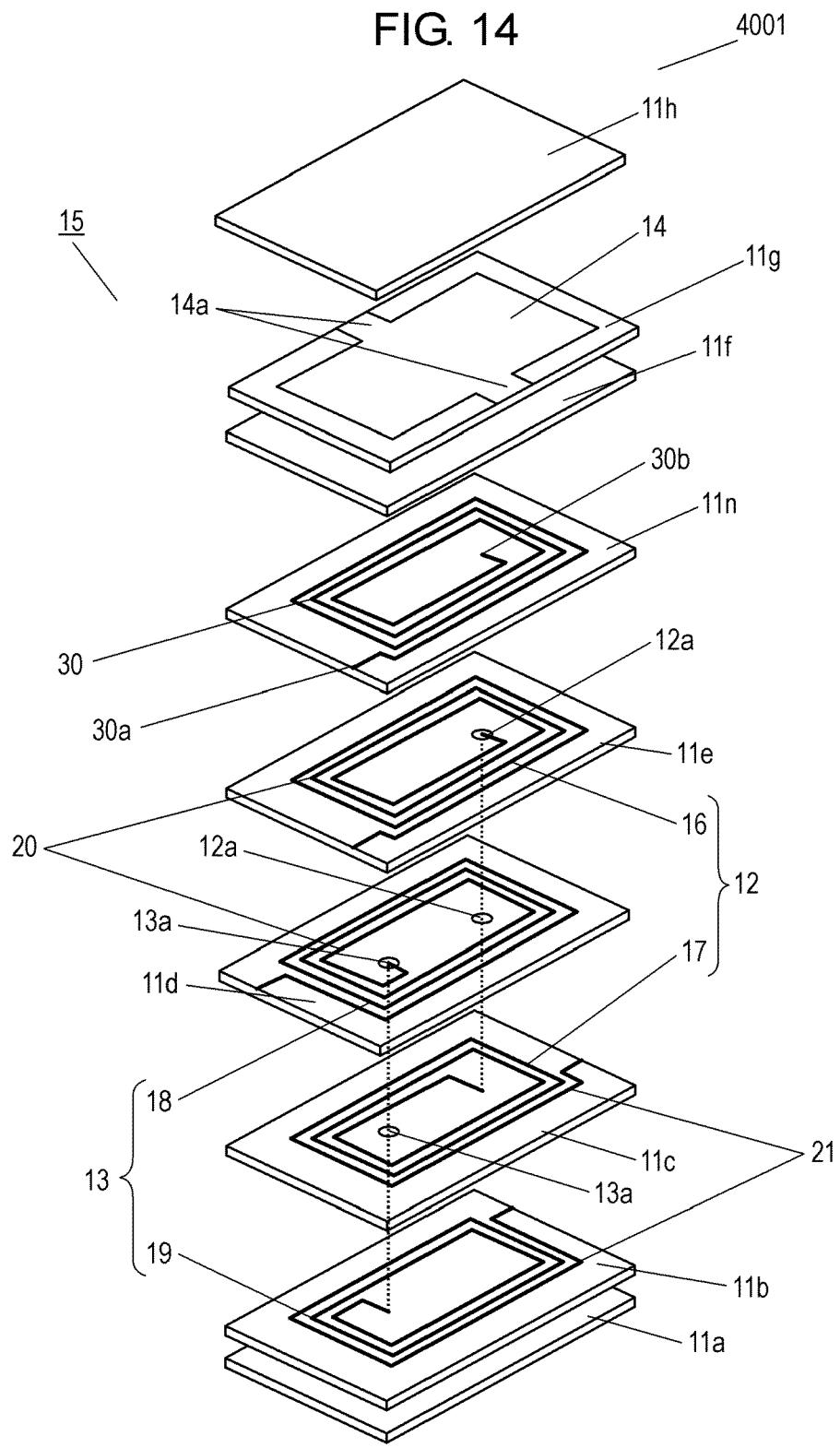
FIG. 14 is an exploded perspective view of a common mode noise filter in accordance with Exemplary Embodiment 4.

FIG. 14 is an exploded perspective view of common mode noise filter 4001 in accordance with Exemplary Embodiment 4. In Embodiment 4, components identical to those of the common mode noise filters according to Embodiments 1 to 3 are denoted by the same reference numerals, and their description may be omitted.

Unlike common mode noise filter 1001 in accordance with Embodiment 1, common mode noise filter 4001 in accordance with Embodiment 4, as shown in FIG. 14, includes coil conductor 30 with a spiral shape which has end part 30a connected to coil conductor 16 and has end part 30b opened. Coil conductor 30 is provided on an upper surface of insulating layer 11n made of a nonmagnetic material, and is provided between coil conductor 16 and insulating layer 11f. End part 30a is electrically connected to coil conductor 16 via external electrode 22.

That is, coil conductor 30 is provided between coil conductor 16 and metal layer 14. Coil conductor 16 is disposed uppermost among coil conductors 16 to 19. Metal layer 14 is disposed above coil conductor 16. Coil conductor 16 is connected to end part 30a of coil conductor 30. Further, a direction in which a current flows through coil conductor 30 is identical to a direction in which a current flows through coil conductor 16 viewing from above.

This configuration, when a common mode noise enters, allows all of coil conductors 16 to 19 which function as an inductor to be magnetically coupled to coil conductor 30, and generates large impedance in coil conductors 16 to 19, thereby generating a voltage difference between coil conductor 30 and each of coil conductors 16 to 19. This causes a stray capacitance. The stray capacitance is combined with coil conductors 16 to 19 and 30 to form a resonant circuit. Therefore, coil conductor 30 has a large impedance at high frequencies. As a result, resonance occurs between coil conductor 30 and metal layer 14, thereby bypassing a common mode noise with a higher frequency to a ground. Thus, attenuation characteristics of common mode noise are improved in a high frequency range, thereby providing common-mode-noise attenuation characteristics in a wide frequency range.

Figure 15:
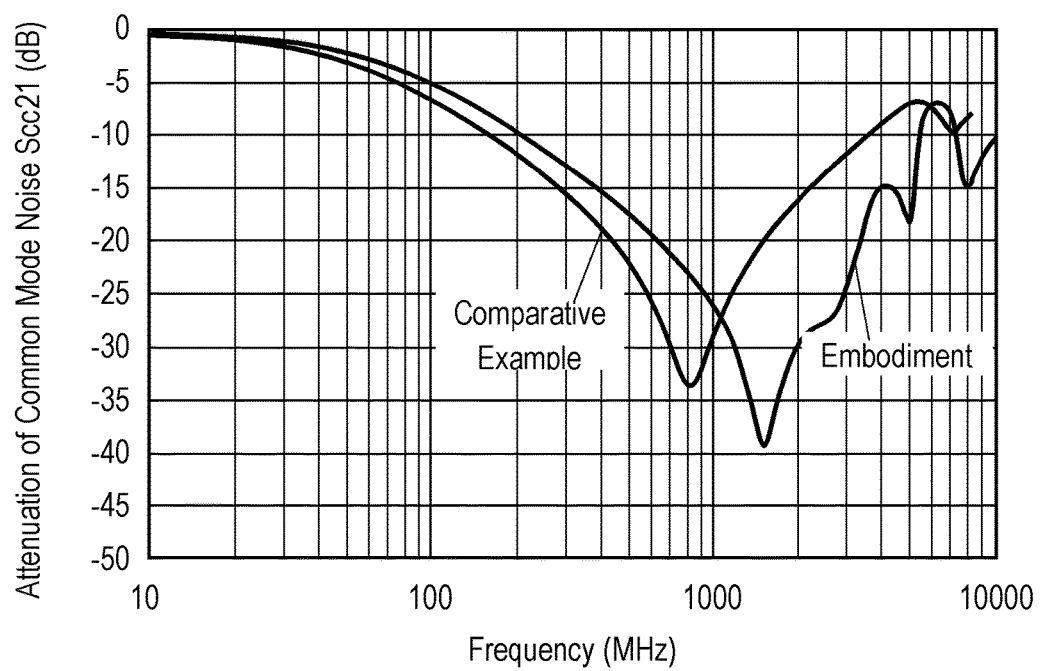
FIG. 15 shows a comparison of common-mode-noise attenuation characteristics of the common mode noise filter shown in FIG. 14 and the conventional common mode noise filter.

FIG. 15 shows a comparison of attenuation characteristics of common mode noise of common mode noise filter 4001 according to Embodiment 4 shown in FIG. 14 and the comparative example of conventional common mode noise filter 500 shown in FIG. 16.

The common mode noise filter according to the embodiment can attenuate a common mode noise of 5 GHz, in addition to attenuating a common mode noise in a frequency band from 700 MHz to 3 GHz. That is, the common mode noise filter according to the embodiment can be used in a WiFi communication band of 5 GHz, in addition to a wireless-communication terminal of a cellular system and a WiFi communication band of a 2.4 GHz band, thus attenuating a common mode noise in a wide frequency range.

On the other hand, when a differential mode signal enters, a magnetic field generated in coil conductors 16 and 18 concentrates between lines of coil conductors 16 and 18. Thus, magnetic field components above and below coil conductor 16 are canceled. Accordingly, coil conductors 16 to 19 function as a transmission path with a small loss without generating large impedance. Therefore, stray capacitance and magnetic coupling are hardly generated between coil conductor 30 and each of coil conductors 16 to 19. This prevents a resonance between coil conductor 30 and metal layer 14 at high frequencies. As a result, a differential signal is not bypassed to a ground, thereby reducing a loss of the differential signal.

As mentioned above, coil conductor 30 disposed above coil conductor 16 allows coil conductor 30 to have different functions depending on transmission modes i.e., a differential mode or a common mode of the noise and signal. Thus, an amount of attenuation of common mode noise can be ensured without deteriorating a differential signal.

In order to increase the area of a portion of metal layer 14 facing coil conductor 30, for example, a part of a coil wire of coil conductor 30 may have a width locally large to increase a capacitance generated between coil conductor 30 and metal layer 14. This configuration allows a frequency of a series resonance between coil conductor 30 and the ground to be easily controlled when a common mode noise enters.

The common mode noise filters according to Embodiments 2 to 4 may further include static-electricity passing parts 27a and 27b of the common mode noise filter according to Embodiment 1.

Each of the common mode noise filters according to Embodiments 1 to 4 includes single coil 12 and single coil 13, but instead, may include an array type of coil including plural coils 12 and plural coils 13.

Each of the common mode noise filters according to Embodiments 1 to 4 includes single common mode filter 20 and single common mode filter 21, but may include plural common mode filters 20 and plural common mode filters 21.

In Embodiments 1 to 4, terms, such as "upper surface", "above", and "below", indicating directions indicate relative directions depending only on a relative positional relationship between components, such as an insulating layer and a coil conductor, of the common mode noise filter, and do not indicate absolute directions.

INDUSTRIAL APPLICABILITY

A common mode noise filter according to the present disclosure has an effect improving attenuation characteristics of a common mode noise in a high frequency range, and is useful in a small thin common-mode-noise filter, i.e., especially used as noise protection of various electronic devices such as digital equipment, AV equipment, and information communication terminals.

REFERENCE MARKS IN THE DRAWINGS 11a insulating layer
11b insulating layer (fourth insulating layer)
11c insulating layer (second insulating layer)
11d insulating layer (third insulating layer)
11e insulating layer (first insulating layer)
11f insulating layer
11g insulating layer (fifth insulating layer)
11h insulating layer
11i insulating layer
11j insulating layer
11k insulating layer
12 coil (first coil)
12a via-electrode
13 coil (second coil)
13a via-electrode
14 metal layer (first metal layer)
15 laminated body
16 coil conductor (first coil conductor)
17 coil conductor (second coil conductor)
18 coil conductor (third coil conductor)
19 coil conductor (fourth coil conductor)
20 common mode filter (first common mode filter)
21 common mode filter (second common mode filter)

The invention claimed is:
1. A common mode noise filter comprising:
first to fifth insulating layers;
a first coil including
a first coil conductor with a spiral shape provided on an upper surface of the first insulating layer, and
a second coil conductor with a spiral shape provided on an upper surface of the second insulating layer, the second coil conductor being provided below the first coil conductor;
a second coil including
a third coil conductor with a spiral shape provided on an upper surface of the third insulating layer, and
a fourth coil conductor with a spiral shape provided on an upper surface of the fourth insulating layer, the fourth coil conductor being provided below the third coil conductor;
a first metal layer provided on an upper surface of the fifth insulating layer;

first to fourth external electrodes connected to the first to fourth coil conductors, respectively; and a fifth external electrode connected to the first metal layer, the fifth external electrode being configured to be connected to a ground, wherein the third coil conductor is provided between the first coil conductor and the second coil conductor, wherein the second coil conductor is provided between the third coil conductor and the fourth coil conductor, wherein the first coil conductor and the third coil conductor are magnetically coupled to each other to form a first common mode filter, wherein the second coil conductor and the fourth coil conductor are magnetically coupled to each other to form a second common mode filter, wherein the first common mode filter is connected in series to the second common mode filter, and wherein the first metal layer is provided above the first coil conductor.

2. The common mode noise filter according to claim 1, wherein the first metal layer faces the first coil conductor across the fifth insulating layer, wherein the first coil conductor does not face an entire of the first metal layer but faces a part of the first metal layer viewing from above.

3. The common mode noise filter according to claim 2, wherein the first metal layer faces the first coil conductor across the fifth insulating layer, and wherein a length of the first coil conductor is different from a length of the second coil conductor.

4. The common mode noise filter according to claim 1, further comprising a first static-electricity passing part electrically connected to the first external electrode, the second external electrode, the third external electrode, the fourth external electrode, and the fifth external electrode, wherein the first static-electricity passing part passes electricity upon having a voltage equal to or higher than a predetermined value applied thereto, and functions as an insulator upon having a voltage lower than the predetermined value applied thereto.

5. The common mode noise filter according to claim 4, wherein the first static-electricity passing part is made of; a varistor material mainly containing zinc oxide; a metallic material containing at least one of aluminum, nickel, or copper; a resin material containing at least one of silicon, epoxy, or phenol; and a space.

6. The common mode noise filter according to claim 4, further comprising a first static-electricty electrode that is electrically connected to the first static-electricity passing part and the fifth external electrode.

7. The common mode noise filter according to claim 1, further comprising:

a second static-electricity passing part that is electrically connected to the first external electrode, the second external electrode, and the fifth external electrode; and a third static-electricity passing part that is electrically connected to the third external electrode, the fourth external electrode, and the fifth external electrode, wherein both the second static-electricity passing part and the third static-electricity passing part pass electricity when a voltage of a predetermined or more value is applied, and function as an insulator when a voltage of less than the predetermined value is applied.

8. The common mode noise filter according to claim 7, wherein the second static-electricity passing part and the third static-electricity passing part are constituted by:

a varistor material based on zinc oxide;

a metallic material containing at least one of aluminum, nickel, or copper;

a resin material containing at least one of silicon, epoxy, or phenol; or a space.

9. The common mode noise filter according to claim 7, further comprising a static-electricity electrode electrically connected to the second static-electricity passing part, the third static-electricity passing part, and the fifth external electrode.

10. The common mode noise filter according to claim 1, further comprising a second metal layer provided below the fourth coil conductor, the second metal layer being configure to be connected to a ground.

11. The common mode noise filter according to claim 1, wherein a distance between the third coil conductor and the second coil conductor is longer than a distance between the first coil conductor and the third coil conductor and a distance between the second coil conductor and the fourth coil conductor.

12. The common mode noise filter according to claim 1, further comprising a fifth coil conductor provided between the first coil conductor and the first metal layer, wherein one end of the fifth coil conductor is connected to the first coil conductor and another end of the fifth coil conductor is opened, and wherein a direction in which a current flows through the first coil conductor is identical to a direction in which a current flows through the fifth coil conductor viewing from above.

13. A common mode noise filter comprising:

first to fifth insulating layers;

a first coil including a first coil conductor with a spiral shape provided on an upper surface of the first insulating layer, and a second coil conductor with a spiral shape provided on an upper surface of the second insulating layer, the second coil conductor being provided below the first coil conductor;

a second coil including a third coil conductor with a spiral shape provided on an upper surface of the third insulating layer, and a fourth coil conductor with a spiral shape provided on an upper surface of the fourth insulating layer, the fourth coil conductor being provided below the third coil conductor;

a first metal layer provided on an upper surface of the fifth insulating layer;

first to fourth external electrodes connected to the first to fourth coil conductors, respectively; and a fifth external electrode connected to the first metal layer, the fifth external electrode being configured to be connected to a ground, wherein the first coil conductor is provided between the second coil conductor and the third coil conductor, wherein the second coil conductor is provided between the first coil conductor and the fourth coil conductor, wherein the first coil conductor and the third coil conductor are magnetically coupled to each other to form a first common mode filter, wherein the second coil conductor and the fourth coil conductor are magnetically coupled to each other to form a second common mode filter, wherein the first common mode filter is connected in series to the second common mode filter, and wherein the first metal layer is provided above the third coil conductor.

14. The common mode noise filter according to claim 13, further comprising a second metal layer provided below the fourth coil conductor, the second metal layer being configured to be connected to a ground.

15. The common mode noise filter according to claim 13, wherein a distance between the first coil conductor and the second coil conductor is longer than a distance between the first coil conductor and the third coil conductor and a distance between the second coil conductor and the fourth coil conductor.

16. The common mode noise filter according to claim 13, further comprising a fifth coil conductor provided between the third coil conductor and the first metal layer,
- wherein one end of the fifth coil conductor is connected to the third coil conductor and another end of the fifth coil conductor is opened, and
- wherein a direction in which a current flows through the third coil conductor is identical to a direction in which a current flows through the fifth coil conductor viewing from above.

* * * * *